(12) United States Patent
Cao et al.

(10) Patent No.: US 11,575,356 B1
(45) Date of Patent: Feb. 7, 2023

(54) FULLY-DIFFERENTIAL TWO-STAGE OPERATIONAL AMPLIFIER CIRCUIT

(71) Applicant: AmpliPHY Technologies Limited, Hangzhou (CN)

(72) Inventors: Tianlin Cao, Hangzhou (CN); Hehong Zou, Hangzhou (CN); Zhiyang Wang, Hangzhou (CN); Sheng Huang, Hangzhou (CN); Qi Chen, Hangzhou (CN)

(73) Assignee: AMPLIPHY TECHNOLOGIES LIMITED, Hangzhou (CN)

( * ) Notice: Subject to any disclaimer, the term of this patent is extended or adjusted under 35 U.S.C. 154(b) by 0 days.

(21) Appl. No.: 17/733,837

(22) Filed: Apr. 29, 2022

(30) Foreign Application Priority Data

Nov. 2, 2021 (CN) .......................... 202111288655.X (51) Int. Cl.
*H03F 3/45* (2006.01)
*H03F 1/02* (2006.01)

(52) U.S. Cl.
CPC ....... *H03F 3/45269* (2013.01); *H03F 1/0211* (2013.01); *H03F 3/45681* (2013.01); *H03F 3/45659* (2013.01)

(58) Field of Classification Search
CPC ............... H03F 3/45269; H03F 1/0211; H03F 3/45681; H03F 3/45183; H03F 3/45179;
(Continued)

(56) References Cited

U.S. PATENT DOCUMENTS 6,388,522 B1 * 5/2002 Fattaruso ............ H03F 3/45183
330/253
6,590,980 B1 * 7/2003 Moraveji ............ H03F 3/45192
380/255

(Continued)

FOREIGN PATENT DOCUMENTS

CN 102394581 A 3/2012

*Primary Examiner* — Khanh V Nguyen
(74) *Attorney, Agent, or Firm* — Muncy, Geissler, Olds & Lowe, P.C.

(57) ABSTRACT

A fully-differential two-stage operational amplifier circuit is provided, and it includes a first-stage amplification circuit, a second-stage amplification circuit, a common-mode signal acquisition circuit, a common-mode feedback circuit and a bias circuit. The first-stage amplification circuit has a telescopic structure and receives differential input signals $IN_P$ and $IN_N$. The second-stage amplification circuit has a common-source structure and outputs differential output signals $OUT_P$ and $OUT_N$. The common-mode signal acquisition circuit receives differential output signals, and outputs an operational amplifier output common-mode signal $V_{CMO}$. The common-mode feedback circuit outputs common-mode feedback signals $VB_1$ and $VB_2$ to the first-stage amplifier circuit and the second-stage amplifier circuit respectively; The bias circuit outputs a bias voltage $VB_3$ to the first-stage amplifier circuit, and outputs bias voltages $VB_4$ and $VB_5$ to the first-stage amplifier circuit respectively.

11 Claims, 5 Drawing Sheets

(58) Field of Classification Search
CPC ............ H03F 3/45192; H03F 3/45089; H03F 3/45659; H03F 3/45475; H03F 3/3022; H03F 3/45071; H03F 3/45085; H03F 3/45479
USPC .................. 330/253, 255, 257, 258, 259
See application file for complete search history.

(56) References Cited

U.S. PATENT DOCUMENTS

| | | | | |
|---|---|---|---|---|
| 6,977,543 | B2* | 12/2005 | Heedley | H03F 3/45188 327/563 |
| 7,129,782 | B2* | 10/2006 | Lebedev | H03F 3/45192 330/253 |
| 7,443,238 | B2* | 10/2008 | Laaser | H03F 1/02 330/253 |
| 7,453,319 | B2* | 11/2008 | Gupta | H03F 3/45654 330/253 |
| 8,854,136 | B2* | 10/2014 | Cavallaro | H03F 3/45183 330/258 |
| 9,467,109 | B2* | 10/2016 | Lee | H03F 3/45659 |
| 10,797,662 | B2* | 10/2020 | Joo | H03F 3/45179 |

* cited by examiner

Prior Art

FULLY-DIFFERENTIAL TWO-STAGE OPERATIONAL AMPLIFIER CIRCUIT

TECHNICAL FIELD

The disclosure relates to A technical field of analog integrated circuits, in particular to a fully-differential two-stage operational amplifier circuit.

BACKGROUND ART

An operational amplifier is widely used in various integrated circuits, and can be used to perform various analog signal operations such as addition, subtraction, multiplication, division, integration and differentiation operations. Compared with an operational amplifier with a single-ended output, a fully-differential operational amplifier is insensitive to common-mode noises and has a larger output swing. Because of a differential output, a common-mode feedback loop is needed to be added in the operational amplifier to stabilize a common-mode level of an output signal.

Figure 1:
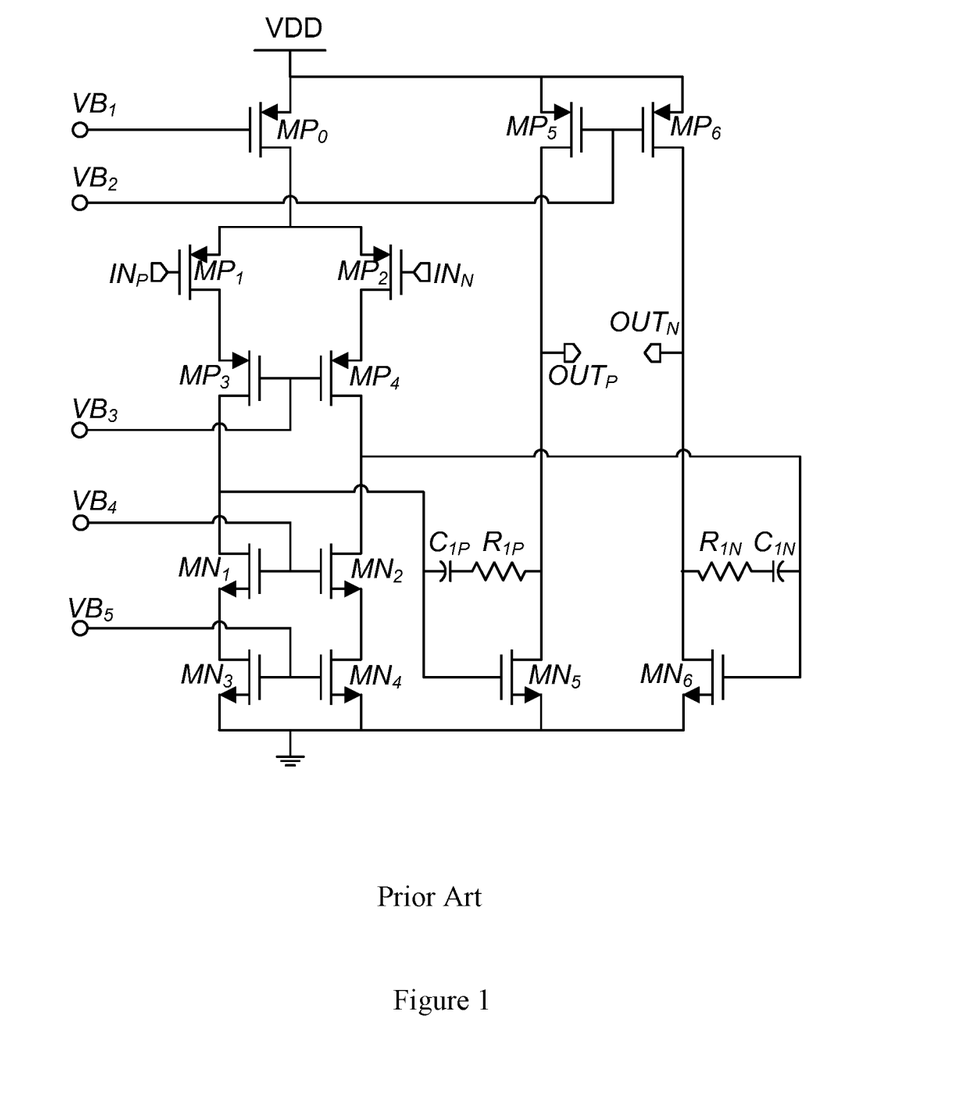
FIG. 1 is a schematic diagram of a main circuit of a two-stage operational amplifier with a telescopic structure in the prior art.

As shown in FIG. 1, it is a main structure of a telescopic two-stage operational amplifier, which does not include a bias circuit and a common-mode feedback circuit. A first stage of the two-stage operational amplifier adopts a telescopic structure, which can provide a high gain; and a second stage thereof adopts a simple common-source structure, which can provide a largest output swing. A complete operational amplifier should include a common-mode feedback circuit in addition to a main circuit shown in FIG. 1. The common-mode feedback circuit generates one or more of five voltages $VB_1 \sim VB_5$ as feedback signals to stably output a common-mode level; and other voltage signals are generated by the bias circuit to provide a proper static operating point.

Figure 2:
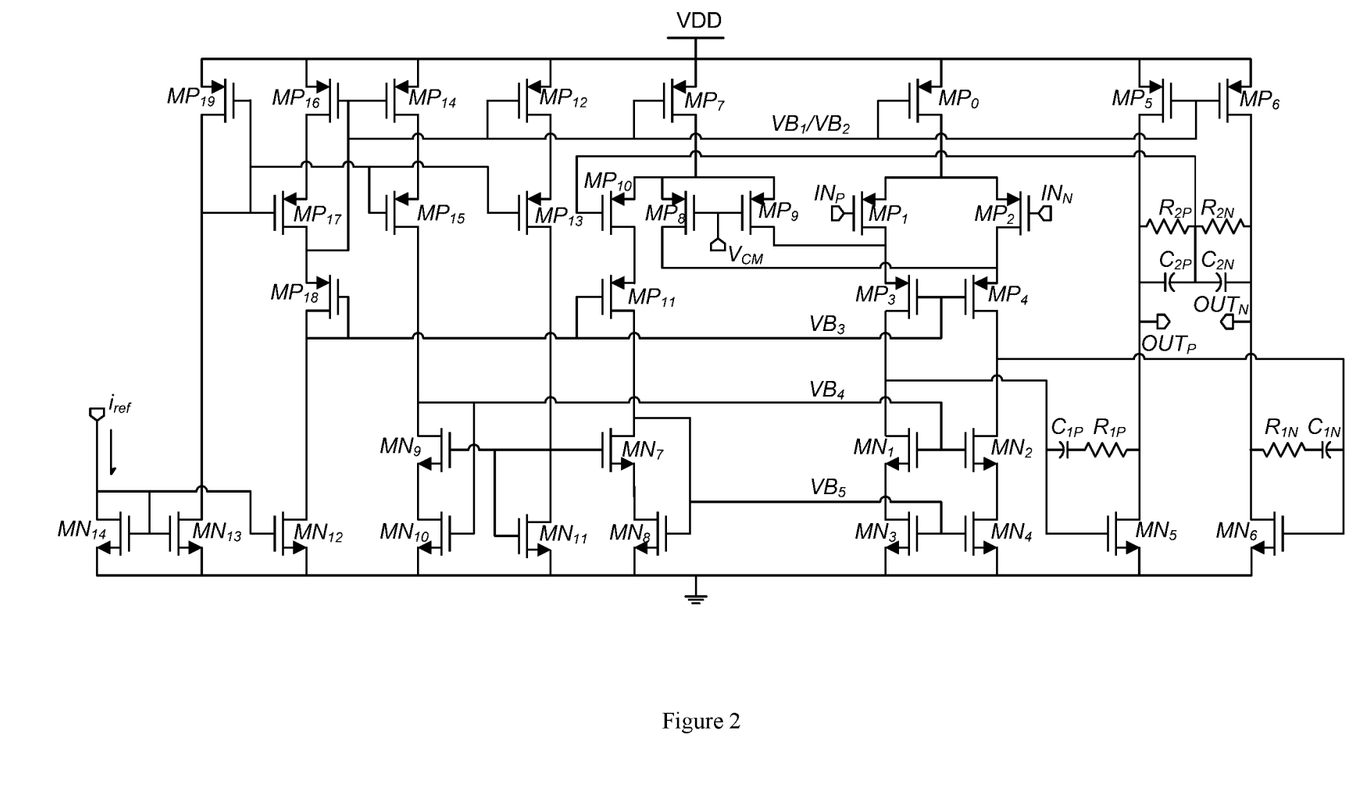
FIG. 2 is a circuit schematic diagram of a traditional fully-differential two-stage operational amplifier with a telescopic structure.

As shown in FIG. 2, this circuit is a traditional implementation of a fully-differential two-stage operational amplifier with a telescopic structure. The common-mode feedback circuit includes seven transistors $MP_7 \sim MP_{11}$ and $MN_7 \sim MN_8$, and generates $VB_5$ as the feedback signal. The bias circuit includes 14 transistors $MP_{12} \sim MP_{19}$ and $MN_9 \sim MN_{14}$, which generate bias voltages $VB_1 \sim VB_4$ and provide bias voltages for the common-mode feedback circuit at the same time. The common-mode feedback circuit and the bias circuit of the operational amplifier described above totally comprise 21 transistors, which presents a complex structure, high hardware consumption and high production cost, and is not conducive to saving area of an integrated circuit.

SUMMARY

To solve the above problems, the technical scheme provided in the disclosure is as follows:

A fully-differential two-stage operational amplifier circuit includes a first-stage amplification circuit, a second-stage amplification circuit, a common-mode signal acquisition circuit, a common-mode feedback circuit and a bias circuit.

The first-stage amplification circuit has a telescopic structure and receives differential input signals $IN_P$ and $IN_N$.

The second-stage amplification circuit has a common-source structure and outputs differential output signals $OUT_P$ and $OUT_N$.

The common-mode signal acquisition circuit receives differential output signals $OUT_P$ and $OUT_N$, and outputs an operational amplifier output common-mode signal $V_{CMO}$.

The common-mode feedback circuit includes a first PMOS transistor, a second PMOS transistor, a first NMOS transistor and a second NMOS transistor. A source of the first PMOS transistor and a source of the second PMOS transistor are respectively connected with an external power supply VDD, and a gate of the first PMOS transistor is respectively connected with a drain of the first PMOS transistor and a drain of the first NMOS transistor. A gate of the second PMOS transistor is connected to a drain of the second PMOS transistor and a drain of the second NMOS transistor respectively, a source of the first NMOS transistor is connected to a source of the second NMOS transistor, a gate of the first NMOS transistor receives an external input reference signal $V_{CM}$, a gate of the second NMOS transistor receives an operational amplifier output common-mode signal $V_{CMO}$, and the drain of the second PMOS transistor and the drain of the first PMOS transistor respectively output common-mode feedback signals $VB_1$ and $VB_2$ to the first-stage amplification circuit and the second-stage amplification circuit.

The bias circuit includes a resistor $R_0$, a third NMOS transistor, a fourth NMOS transistor, a fifth NMOS transistor and a sixth NMOS transistor. A positive terminal of the resistor $R_0$ receives a reference current $i_{ref}$, and the positive terminal of the resistor $R_0$ is connected with a gate of the third NMOS transistor and a gate of the fifth NMOS transistor respectively. A negative terminal of the resistor $R_0$ is connected with a drain of the fifth NMOS transistor, a gate of the sixth NMOS transistor and a gate of the fourth NMOS transistor respectively, a source of the fifth NMOS transistor is connected with a drain of the sixth NMOS transistor, a drain of the third NMOS transistor is connected with the source of the first NMOS transistor and the source of the second NMOS transistor respectively, and a source of the third NMOS transistor is connected with a drain of the fourth NMOS transistor, a source of the fourth NMOS transistor and a source of the sixth NMOS transistor are both grounded, the drain of the third NMOS transistor outputs a bias voltage $VB_3$ to the first-stage amplifier circuit, and the positive and negative terminals of the resistor $R_0$ respectively output bias voltages $VB_4$ and $VB_5$ to the first-stage amplifier circuit.

It is further provided in the disclosure that the first-stage amplifying circuit further includes a third PMOS transistor, a fourth PMOS transistor, a fifth PMOS transistor, a sixth PMOS transistor, a seventh PMOS transistor, a seventh NMOS transistor, an eighth NMOS transistor, a ninth NMOS transistor and a tenth NMOS transistor. A source of the third PMOS transistor is connected with the external power supply VDD, a drain of the third PMOS transistor is connected with a source of the fourth PMOS transistor and a source of the fifth PMOS transistor respectively, a drain of the fourth PMOS transistor is connected to a source of the sixth PMOS transistor, a drain of the fifth PMOS transistor is connected with a source of the seventh PMOS transistor, a drain of the sixth PMOS transistor is connected with a drain of the seventh PMOS transistor, the drain of the seventh PMOS transistor is connected with a drain of the eighth NMOS transistor, the source of the seventh NMOS transistor is connected to a drain of the ninth NMOS transistor, a source of the eighth NMOS transistor is connected with a drain of the tenth NMOS transistor, and a source of the ninth NMOS transistor and a source of the tenth NMOS transistor are both grounded.

A gate of the fourth PMOS transistor and a gate of the fifth PMOS transistor are respectively connected with the differential input signals $IN_P$ and $IN_N$, the drain of the second PMOS transistor outputs the common-mode feedback signal $VB_1$ to a gate of the third PMOS transistor, and the drain of the third NMOS transistor outputs the bias voltage $VB_3$ to a gate of the sixth PMOS transistor and a gate of the seventh PMOS transistor. The positive terminal of the resistor $R_0$ outputs the bias voltage $VB_4$ to a gate of the seventh NMOS transistor and a gate of the eighth NMOS transistor respectively, and the negative terminal of the resistor $R_0$ outputs the bias voltage $VB_5$ to a gate of the ninth NMOS transistor and a gate of the tenth NMOS transistor respectively.

It is further provided in the disclosure that the second-stage amplifying circuit further includes an eighth PMOS transistor, a ninth PMOS transistor, an eleventh NMOS transistor and a twelfth NMOS transistor. A source of the eighth PMOS transistor and a source of the ninth PMOS transistor are respectively connected with the external power supply VDD, a drain of the eighth PMOS transistor is connected with a drain of the eleventh NMOS transistor, and a drain of the ninth PMOS transistor is connected with a drain of the twelfth NMOS transistor, a source of the eleventh NMOS transistor and a source of the twelfth NMOS transistor are both grounded, the drain of the sixth PMOS transistor is connected with a gate of the eleventh NMOS transistor, and the drain of the seventh PMOS transistor is connected with a gate of the twelfth NMOS transistor.

The drain of the first PMOS transistor outputs the common-mode feedback signal $VB_2$ to a gate of the eighth PMOS transistor and a gate of the ninth PMOS transistor respectively.

It is further provided in the disclosure that it includes a frequency compensation circuit, which includes a first resistor, a second resistor, a first capacitor and a second capacitor. The first resistor and the first capacitor are connected in series, a terminal of the first resistor is connected with the drain of the eleventh NMOS transistor and a terminal of the first capacitor is connected with the drain of the sixth PMOS transistor; and the second resistor and the second capacitor are connected in series, a terminal of the second resistor is connected with the drain of the twelfth NMOS transistor and a terminal of the second capacitor is connected with the drain of the seventh PMOS transistor.

It is further provided in the disclosure that the common-mode signal acquisition circuit further includes a third resistor, a fourth resistor, a third capacitor and a fourth capacitor. The third resistor and the fourth resistor are connected in series between the differential output signals $OUT_P$ and $OUT_N$; the third capacitor and the fourth capacitor are connected in series between the differential output signals $OUT_P$ and $OUT_N$; the third resistor and the third capacitor are connected in parallel, the fourth resistor and the fourth capacitor are connected in parallel; and the operational amplifier output common-mode signal $V_{CMO}$ is output at a common connecting point of the third resistor, the fourth resistor, the third capacitor and the fourth capacitor.

It is further provided in the disclosure that the first PMOS transistor and the second PMOS transistor are PMOS transistors of a same type, and the first NMOS transistor and the second NMOS transistor are NMOS transistors of a same type.

It is further provided in the disclosure that the first resistor and the second resistor are of a same type, and the first capacitor and the second capacitor are of a same type.

It is further provided in the disclosure that the third resistor and the fourth resistor are of a same type, and the third capacitor and the fourth capacitor are of a same type.

Compared with the prior art, the technical schemes provided in the disclosure have the following beneficial effects:

This technical scheme includes an operational amplifier control integrated circuit based on a telescopic two-stage operational amplifier. The first-stage amplifier circuit is of a telescopic cascode structure with a PMOS transistor differential input, which includes nine MOS transistors and can provide a high gain. The second stage amplifier circuit is of a common-source structure, which can provide a largest output swing. The common-mode feedback circuit and the bias circuit only need 8 transistors and one resistor in total, in which the first NMOS transistor and the second NMOS transistor form a differential pair, respectively receiving the external input reference signal $V_{CM}$ and the operational amplifier output common-mode signal $V_{CMO}$ and amplifying a difference between them. The first PMOS transistor and the second PMOS transistor are diode-connected PMOS transistors, which form a load of the differential pair and generate the common-mode feedback signals $VB_1$ and $VB_2$ respectively. The common-mode feedback signals $VB_1$ and $VB_2$ both provide negative feedback to the output common-mode signal $V_{CMO}$ of the operational amplifier, and at the same time function to stabilize the output common-mode level. Because there are two negative feedback loops at the same time, a gain of a common-mode feedback loop can be increased. The source of the first NMOS transistor and the source of the second NMOS transistor are connected with the drain of the third NMOS transistor and provide a bias voltage $VB_3$, and the gate of the third NMOS transistor and the gate of the fourth NMOS transistor are respectively connected to the gate of the seventh NMOS transistor, the gate of the eighth NMOS transistor, the gate of the ninth NMOS transistor and the gate of the tenth NMOS transistor to form a current source with a cascade structure, so as to provide a bias current for the differential pair composed of the first NMOS transistor and the second NMOS transistor. The positive and negative terminals of the resistor $R_0$ are respectively connected with the gate of the fifth NMOS transistor and the gate of the sixth NMOS transistor. The bias circuit composed of the resistor $R_0$, the fifth NMOS transistor and the sixth NMOS transistor provides bias voltages $VB_4$ and $VB_5$.

The disclosure provides a compact fully-differential two-stage operational amplifier circuit.

With a gain and stability of the common-mode feedback loop being ensured, the common-mode feedback circuit and the bias circuit only need one resistor and eight transistors, which simplifies a designed structure of a traditional fully-differential two-stage operational amplifier with a telescopic structure, reduces consumption of elements and hardware, and is beneficial to saving area of the integrated circuit. Moreover, the common-mode feedback loop of the disclosure has fewer transistors, so it has fewer poles and is easier to realize loop stability.

DETAILED DESCRIPTION

In order to further understand contents of the present disclosure, the present disclosure will be described in detail with reference to drawings and examples.

In description of this disclosure, it should be noted that unless otherwise specified and limited, terms "installing", "coupling" and "connecting" should be understood broadly, for example, it can be "fixedly connecting", "integrally connecting", or "detachably connecting"; or it can be "mechanically connecting" or "electrically connecting", or it can be "communicating within two elements"; or it can be "directly connecting" or "indirectly connecting through an intermediate medium", and specific meanings of the above terms can be understood according to specific situations for ordinary skilled in the art.

Figure 3:
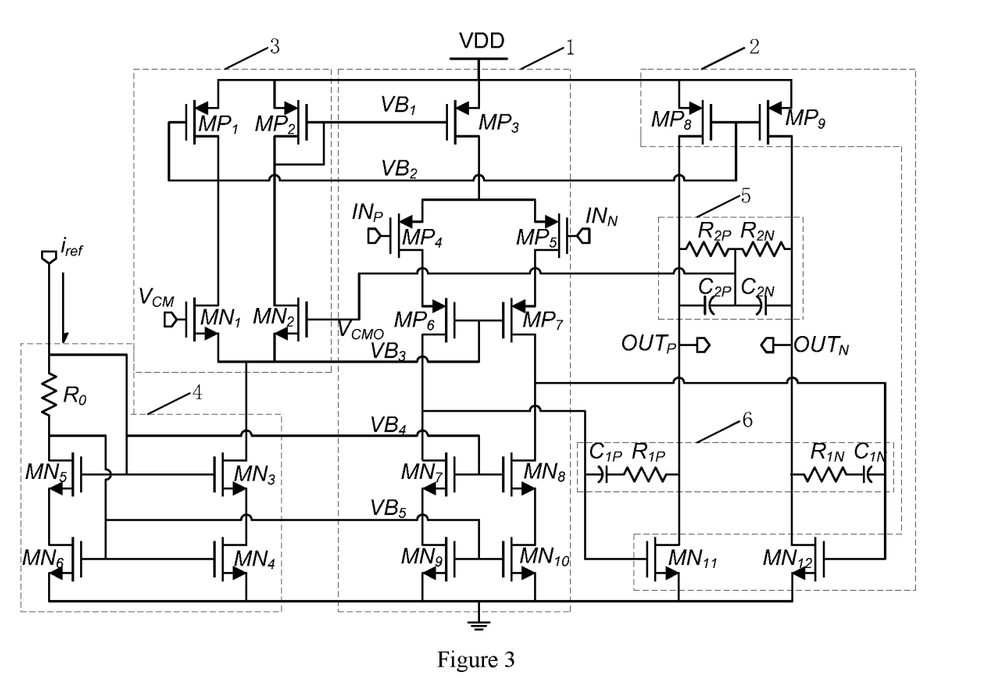
FIG. 3 is a schematic circuit diagram of a fully-differential two-stage operational amplifier according to an embodiment of the present disclosure.

In combination with FIG. 3, a technical scheme of the present disclosure is a fully-differential two-stage operational amplifier circuit, which includes a first-stage amplifier circuit 1, a second-stage amplifier circuit 2, a common-mode signal acquisition circuit 5, a common-mode feedback circuit 3, a bias circuit 4 and a frequency compensation circuit 6.

The first-stage amplifier circuit 1 has a telescopic structure and receives differential input signals $IN_P$ and $IN_N$.

The second-stage amplification circuit 2 has a common-source structure and outputs differential output signals $OUT_P$ and $OUT_N$.

The common-mode signal acquisition circuit 5 receives differential output signals $OUT_P$ and $OUT_N$, and outputs an operational amplifier output common-mode signal $V_{CMO}$.

The common-mode feedback circuit 3 includes a first PMOS transistor $MP_1$, a second PMOS transistor $MP_2$, a first NMOS transistor $MN_1$ and a second NMOS transistor $MN_2$. The first PMOS transistor $MP_1$ and the second PMOS transistor $MP_2$ are PMOS transistors of a same type, and the first NMOS transistor $MN_1$ and the second NMOS transistor $MN_2$ are NMOS transistors of a same type. A source of the first PMOS transistor $MP_1$ and a source of the second PMOS transistor $MP_2$ are respectively connected with an external power supply VDD, and a gate of the first PMOS transistor $MP_1$ is respectively connected with a drain of the first PMOS transistor $MP_1$ and a drain of the first NMOS transistor $MN_1$. A gate of the second PMOS transistor $MP_2$ is connected to a drain of the second PMOS transistor $MP_2$ and a drain of the second NMOS transistor $MN_2$ respectively, a source of the first NMOS transistor $MN_1$ is connected to a source of the second NMOS transistor $MN_2$, a gate of the first NMOS transistor $MN_1$ receives an external input reference signal $V_{CM}$, a gate of the second NMOS transistor $MN_2$ receives an operational amplifier output common-mode signal $V_{CMO}$, and the drain of the second PMOS transistor $MP_2$ and the drain of the first PMOS transistor $MP_1$ respectively output common-mode feedback signals $VB_1$ and $VB_2$ to the first-stage amplification circuit 1 and the second-stage amplification circuit 2.

The bias circuit includes a resistor $R_0$, a third NMOS transistor $MN_3$, a fourth NMOS transistor $MN_4$, a fifth NMOS transistor $MN_5$ and a sixth NMOS transistor $MN_6$. A positive terminal of the resistor $R_0$ receives a reference current $i_{ref}$, and the positive terminal of the resistor $R_0$ is connected with a gate of the third NMOS transistor $MN_3$ and a gate of the fifth NMOS transistor $MN_5$ respectively. A negative terminal of the resistor $R_0$ is connected with a drain of the fifth NMOS transistor $MN_5$, a gate of the sixth NMOS transistor $MN_6$ and a gate of the fourth NMOS transistor $MN_4$ respectively, a source of the fifth NMOS transistor $MN_5$ is connected with a drain of the sixth NMOS transistor $MN_6$, a drain of the third NMOS transistor $MN_3$ is connected with the source of the first NMOS transistor $MN_1$ and the source of the second NMOS transistor $MN_2$ respectively, and a source of the third NMOS transistor $MN_3$ is connected with a drain of the fourth NMOS transistor $MN_4$, a source of the fourth NMOS transistor $MN_4$ and a source of the sixth NMOS transistor $MN_6$ are both grounded, the drain of the third NMOS transistor $MN_3$ outputs a bias voltage $VB_3$ to the first-stage amplifier circuit 1, and the positive and negative terminals of the resistor $R_0$ respectively output bias voltages $VB_4$ and $VB_5$ to the first-stage amplifier circuit 1.

The first-stage amplifying circuit 1 further includes a third PMOS transistor $MP_3$, a fourth PMOS transistor $MP_4$, a fifth PMOS transistor $MP_5$, a sixth PMOS transistor $MP_6$, a seventh PMOS transistor $MP_7$, a seventh NMOS transistor $MN_7$, an eighth NMOS transistor $MN_8$, a ninth NMOS transistor $MN_9$ and a tenth NMOS transistor $MN_{10}$. A source of the third PMOS transistor $MP_3$ is connected with the external power supply VDD, a drain of the third PMOS transistor $MP_3$ is connected with a source of the fourth PMOS transistor $MP_4$ and a source of the fifth PMOS transistor $MP_5$ respectively, a drain of the fourth PMOS transistor $MP_4$ is connected to a source of the sixth PMOS transistor $MP_6$, a drain of the fifth PMOS transistor $MP_5$ is connected with a source of the seventh PMOS transistor $MP_7$, a drain of the sixth PMOS transistor $MP_6$ is connected with a drain of the seventh PMOS transistor $MN_7$, the drain of the seventh PMOS transistor $MP_7$ is connected with a drain of the eighth NMOS transistor $MN_8$, the source of the seventh NMOS transistor $MN_7$ is connected to a drain of the ninth NMOS transistor $MN_9$, a source of the eighth NMOS transistor $MN_8$ is connected with a drain of the tenth NMOS transistor $MN_{10}$, and a source of the ninth NMOS transistor $MN_9$ and a source of the tenth NMOS transistor $MN_{10}$ are both grounded.

A gate of the fourth PMOS transistor $MP_4$ and a gate of the fifth PMOS transistor $MP_5$ are respectively connected with the differential input signals $IN_P$ and $IN_N$, the drain of the second PMOS transistor $MP_2$ outputs the common-mode feedback signal $VB_1$ to a gate of the third PMOS transistor $MP_3$, and the drain of the third NMOS transistor $MN_3$ outputs the bias voltage $VB_3$ to a gate of the sixth PMOS transistor $MP_6$ and a gate of the seventh PMOS transistor $MP_7$. The positive terminal of the resistor $R_0$ outputs the bias voltage $VB_4$ to a gate of the seventh NMOS transistor $MN_7$ and a gate of the eighth NMOS transistor $MN_8$ respectively, and the negative terminal of the resistor $R_0$ outputs the bias voltage $VB_5$ to a gate of the ninth NMOS transistor $MN_9$ and a gate of the tenth NMOS transistor $MN_{10}$ respectively.

The second-stage amplifying circuit further includes an eighth PMOS transistor $MP_8$, a ninth PMOS transistor $MP_9$, an eleventh NMOS transistor $MN_{11}$ and a twelfth NMOS transistor $MN_{12}$. A source of the eighth PMOS transistor $MP_8$ and a source of the ninth PMOS transistor $MP_9$ are respectively connected with the external power supply VDD, a drain of the eighth PMOS transistor $MP_8$ is connected with a drain of the eleventh NMOS transistor $MN_{11}$, and a drain of the ninth PMOS transistor $MP_9$ is connected with a drain of the twelfth NMOS transistor $MN_{12}$, a source of the eleventh NMOS transistor $MN_{11}$ and a source of the twelfth NMOS transistor MN 2 are both grounded, the drain of the sixth PMOS transistor $MP_6$ is connected with a gate of the eleventh NMOS transistor $MN_{11}$, and the drain of the seventh PMOS transistor $MP_7$ is connected with a gate of the twelfth NMOS transistor $MN_{12}$.

The drain of the first PMOS transistor $MP_1$ outputs the common-mode feedback signal $VB_2$ to a gate of the eighth PMOS transistor $MP_8$ and a gate of the ninth PMOS transistor $MP_9$ respectively.

The frequency compensation circuit 6 includes a first resistor $R_{1P}$, a second resistor $R_{1N}$, a first capacitor $C_{1P}$ and a second capacitor $C_{1N}$. The first resistor $R_{1P}$ and the second resistor $R_{1N}$ are of a same type, and the first capacitor $C_{1P}$ and the second capacitor $C_{1N}$ are of a same type. The first resistor $R_{1P}$ and the first capacitor $C_{1P}$ are connected in series, a terminal of the first resistor $R_{1P}$ is connected with the drain of the eleventh NMOS transistor $MN_{11}$ and a terminal of the first capacitor $C_{1P}$ is connected with the drain of the sixth PMOS transistor $MP_6$; and the second resistor $R_{1N}$ and the second capacitor $C_{1N}$ are connected in series, a terminal of the second resistor $R_{1N}$ is connected with the drain of the twelfth NMOS transistor $MN_{12}$ and a terminal of the second capacitor $C_{1N}$ is connected with the drain of the seventh PMOS transistor $MP_7$.

The common-mode signal acquisition circuit 5 further includes a third resistor $R_{2P}$, a fourth resistor $R_{2N}$, a third capacitor $C_{2P}$ and a fourth capacitor $C_{2N}$. The third resistor $R_{2P}$ and the fourth resistor $R_{2N}$ are of a same type, and the third capacitor $C_{2P}$ and the fourth capacitor $C_{2N}$ are of a same type. The third resistor $R_{2P}$ and the fourth resistor $R_{2N}$ are connected in series between the differential output signals $OUT_P$ and $OUT_N$; the third capacitor $C_{2P}$ and the forth capacitor $C_{2N}$ are connected in series between the differential output signals $OUT_P$ and $OUT_N$; the third resistor $R_{2P}$ and the third capacitor $C_{2P}$ are connected in parallel, the fourth resistor $R_{2N}$ and the fourth capacitor $C_{2N}$ are connected in parallel; and the operational amplifier output common-mode signal $V_{CMO}$ is output at a common connecting point of the third resistor $R_{2P}$, the fourth resistor $R_{2N}$, the third capacitor $C_{2P}$ and the fourth capacitor $C_{2N}$.

This disclosure includes an operational amplifier control integrated circuit based on a telescopic two-stage operational amplifier. The first-stage amplifier circuit is of a telescopic cascode structure with a PMOS transistor differential input, which can provide a high gain. The second stage amplifier circuit is of a common-source structure, which can provide a largest output swing. The common-mode feedback circuit and the bias circuit only need 8 transistors and one resistor in total, in which the first NMOS transistor $MN_1$ and the second NMOS transistor $MN_2$ form a differential pair, respectively receiving the external input reference signal $V_{CM}$ and the operational amplifier output common-mode signal $V_{CMO}$ and amplifying a difference between them. The first PMOS transistor $MP_1$ and the second PMOS transistor $MP_2$ are diode-connected PMOS transistors, which form a load of the differential pair and generate the common-mode feedback signals $VB_1$ and $VB_2$ respectively. The common-mode feedback signals $VB_1$ and $VB_2$ both provide negative feedback to the output common-mode signal $V_{CMO}$ of the operational amplifier, and at the same time function to stabilize the output common-mode level. Because there are two negative feedback loops at the same time, a gain of a common-mode feedback loop can be increased. The source of the first NMOS transistor $MN_1$ and the source of the second NMOS transistor $MN_2$ are connected with the drain of the third NMOS transistor $MN_3$ and provide a bias voltage $VB_3$, the bias voltage $VB_3$ is equal to the external input reference signal $V_{CM}$ minus a gate-source voltage of the first PMOS transistor $MP_1$ or the second PMOS transistor $MP_2$; and the gate of the third NMOS transistor $MN_3$ and the gate of the fourth NMOS transistor $MN_4$ are respectively connected to the gate of the seventh NMOS transistor $MN_7$, the gate of the eighth NMOS transistor $MN_8$, the gate of the ninth NMOS transistor $MN_9$ and the gate of the tenth NMOS transistor $MN_{10}$ to form a current source with a cascade structure, so as to provide a bias current for the differential pair composed of the first NMOS transistor $MN_1$ and the second NMOS transistor $MN_2$. The positive and negative terminals of the resistor $R_0$ are respectively connected with the gate of the fifth NMOS transistor $MN_5$ and the gate of the sixth NMOS transistor $MN_6$. The bias circuit composed of the resistor $R_0$, the fifth NMOS transistor $MN_5$ and the sixth NMOS transistor $MN_6$ provides bias voltages $VB_4$ and $VB_5$.

A formula (1) for calculating a common mode feedback loop gain of the fully-differential two-stage operational amplifier circuit is as follows:

$$\text{Gain}_{\_CMFB}=(gm_{N1}/gm_{P1})\times\{gm_{P8}+gm_{N11}\times gm_{P3}\times[gm_{P4}\times ro_{P4}\times gm_{P6}\times ro_{P6}\times ro_{P3}\|gm_{N7}\times ro_{N7}\times(ro_{N9}/2)]\}\times(ro_{P8}\|ro_{N11})$$

Equation (1).

Figure 4:
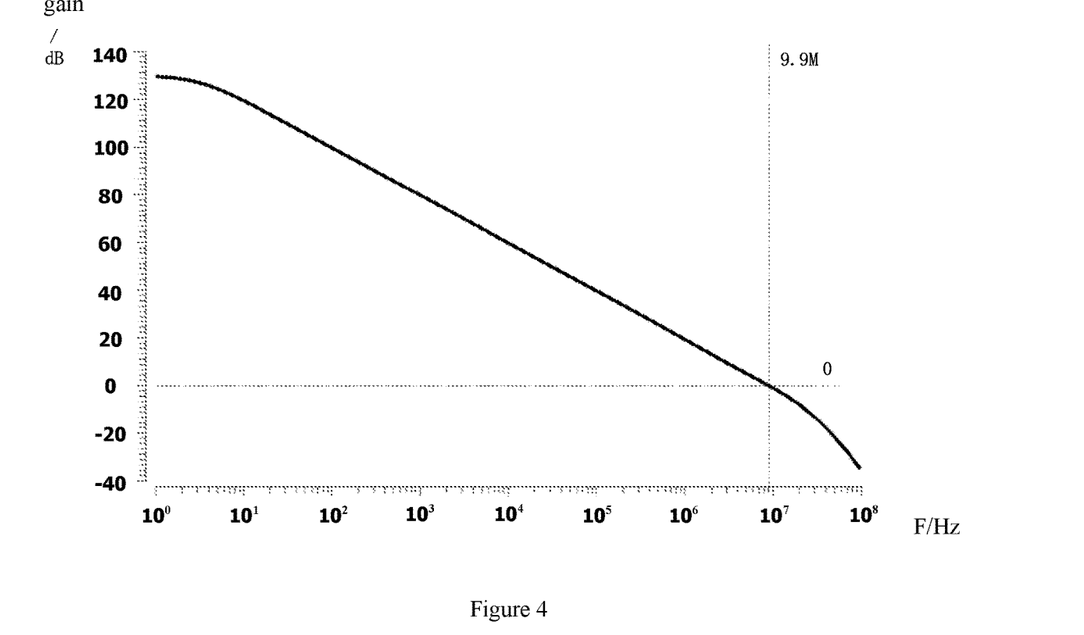
FIG. 4 is a schematic diagram of simulation of a common mode response frequency and a gain of a traditional fully-differential two-stage operational amplifier circuit with a telescopic structure.
Figure 5:
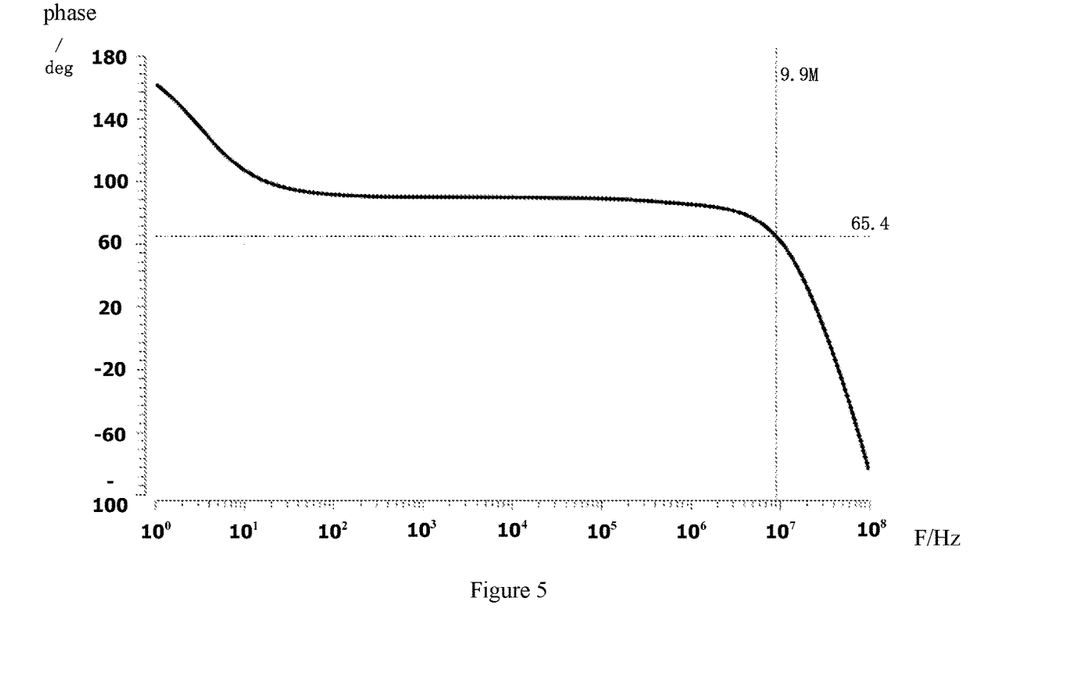
FIG. 5 is a schematic diagram of simulation of a common mode response frequency and a phase of a traditional fully-differential two-stage operational amplifier circuit with a telescopic structure.
Figure 6:
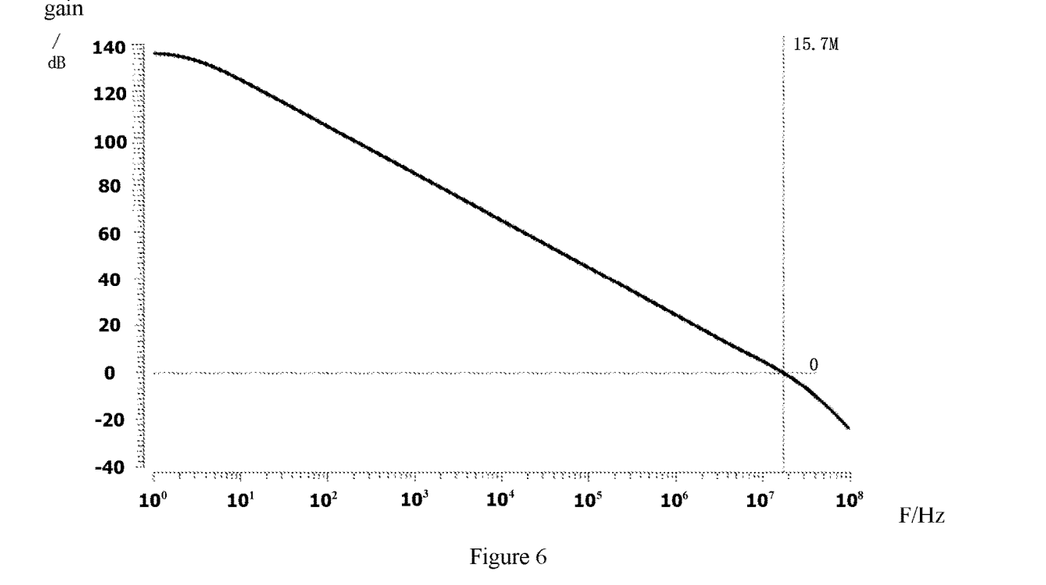
FIG. 6 is a schematic diagram of simulation of a common mode response frequency and a gain of a fully-differential two-stage operational amplifier circuit according to an embodiment of the present disclosure.
Figure 7:
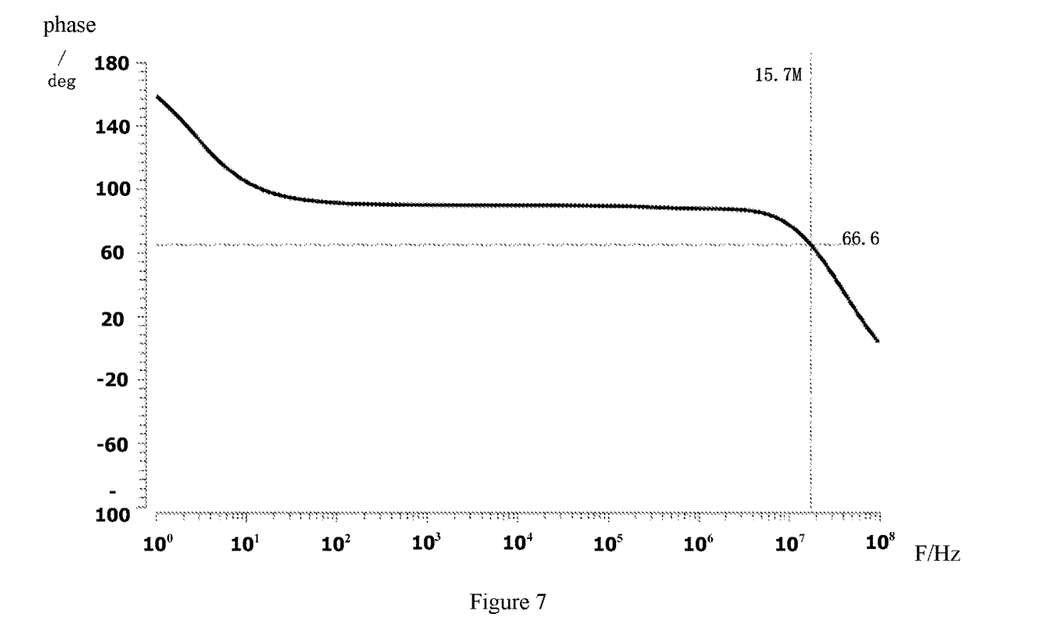
FIG. 7 is a schematic diagram of simulation of a common mode response frequency and a phase of a fully-differential two-stage operational amplifier circuit according to an embodiment of the present disclosure.

FIG. 4 and FIG. 5 are schematic diagrams of simulation of a common-mode response of the traditional fully-differential two-stage operational amplifier circuit with the telescopic structure in FIG. 2, and FIG. 6 and FIG. 7 are schematic diagrams of simulation of a common-mode response of the fully-differential two-stage operational amplifier circuit in FIG. 3 according to the embodiment of the present disclosure. By comparing FIGS. 4-7, the common-mode feedback loop of the circuit according to the present disclosure presents a higher loop gain and a better loop stability.

In this disclosure, with a gain and stability of the common-mode feedback loop being ensured, the common-mode feedback circuit and the bias circuit only need one resistor and eight transistors, which simplifies a designed structure of the traditional fully-differential two-stage operational amplifier with the telescopic structure, reduces consumption of elements and hardware, reduces production cost and is beneficial to saving area of the integrated circuit.

The present disclosure and embodiments thereof are described above in an illustrative manner, which is not restrictive; and what is shown in the drawings is only one of the embodiments of the present disclosure, and its actual structure is not limited thereto. Therefore, structures and embodiments similar to the technical scheme designed by those of ordinary skilled in the art inspired by this disclosure without creativity, without departing from the creative purpose of the present disclosure, are all within a protection scope of the present disclosure.

The invention claimed is:

1. A fully-differential two-stage operational amplifier circuit, comprising a first-stage amplification circuit, a second-stage amplification circuit, a common-mode signal acquisition circuit, a common-mode feedback circuit, and a bias circuit; wherein the first-stage amplification circuit has a cascade structure, and the first-stage amplification circuit receives differential input signals $IN_P$ and $IN_N$;

the second-stage amplification circuit has a common-source structure, and the second-stage amplification circuit outputs differential output signals $OUT_P$ and $OUT_N$;

the common-mode signal acquisition circuit receives the differential output signals $OUT_P$ and $OUT_N$, and outputs an operational amplifier output common-mode signal $V_{CMO}$;

the first-stage amplification circuit is connected with the second-stage amplification circuit;

the common-mode feedback circuit comprises a first PMOS transistor, a second PMOS transistor, a first NMOS transistor, and a second NMOS transistor, a source of the first PMOS transistor and a source of the second PMOS transistor being respectively connected with an external power supply VDD, and a gate of the first PMOS transistor being respectively connected with a drain of the first PMOS transistor and a drain of the first NMOS transistor, a gate of the second PMOS transistor being connected to a drain of the second PMOS transistor and a drain of the second NMOS transistor respectively, a source of the first NMOS transistor being connected to a source of the second NMOS transistor, a gate of the first NMOS transistor receiving an external input reference signal $V_{CM}$, a gate of the second NMOS transistor receiving the operational amplifier output common-mode signal $V_{CMO}$, and the drain of the second PMOS transistor and the drain of the first PMOS transistor respectively outputting common-mode feedback signals $VB_1$ and $VB_2$ to the first-stage amplification circuit and the second-stage amplification circuit; and the bias circuit comprises a resistor $R_0$, a third NMOS transistor, a fourth NMOS transistor, a fifth NMOS transistor and a sixth NMOS transistor, a positive terminal of the resistor $R_0$ receiving a reference current $i_{ref}$, and the positive terminal of the resistor $R_0$ being connected with a gate of the third NMOS transistor and a gate of the fifth NMOS transistor respectively, a negative terminal of the resistor $R_0$ being connected with a drain of the fifth NMOS transistor, a gate of the sixth NMOS transistor and a gate of the fourth NMOS transistor respectively, a source of the fifth NMOS transistor being connected with a drain of the sixth NMOS transistor, a drain of the third NMOS transistor being connected with the source of the first NMOS transistor and the source of the second NMOS transistor respectively, and a source of the third NMOS transistor being connected with a drain of the fourth NMOS transistor, a source of the fourth NMOS transistor and a source of the sixth NMOS transistor being both grounded, the drain of the third NMOS transistor outputting a bias voltage $VB_3$ to the first-stage amplifier circuit, and the positive and negative terminals of the resistor $R_0$ respectively outputting bias voltages $VB_4$ and $VB_5$ to the first-stage amplifier circuit.

2. The fully-differential two-stage operational amplifier circuit according to claim 1, wherein the first-stage amplifying circuit further comprises a third PMOS transistor, a fourth PMOS transistor, a fifth PMOS transistor, a sixth PMOS transistor, a seventh PMOS transistor, a seventh NMOS transistor, an eighth NMOS transistor, a ninth NMOS transistor and a tenth NMOS transistor, a source of the third PMOS transistor being connected with the external power supply VDD, a drain of the third PMOS transistor being connected with a source of the fourth PMOS transistor and a source of the fifth PMOS transistor respectively, a drain of the fourth PMOS transistor being connected to a source of the sixth PMOS transistor, a drain of the fifth PMOS transistor being connected with a source of the seventh PMOS transistor, a drain of the sixth PMOS transistor being connected with a drain of the seventh PMOS transistor, the drain of the seventh PMOS transistor being connected with a drain of the eighth NMOS transistor, the source of the seventh NMOS transistor being connected to a drain of the ninth NMOS transistor, a source of the eighth NMOS transistor being connected with a drain of the tenth NMOS transistor, and a source of the ninth NMOS transistor and a source of the tenth NMOS transistor being both grounded; and a gate of the fourth PMOS transistor and a gate of the fifth PMOS transistor being respectively connected with the differential input signals $IN_P$ and $IN_N$, the drain of the second PMOS transistor outputting the common-mode feedback signal $VB_1$ to a gate of the third PMOS transistor, and the drain of the third NMOS transistor outputting the bias voltage $VB_3$ to a gate of the sixth PMOS transistor and a gate of the seventh PMOS transistor, the positive terminal of the resistor $R_0$ outputting the bias voltage $VB_4$ to a gate of the seventh NMOS transistor and a gate of the eighth NMOS transistor respectively, and the negative terminal of the resistor $R_0$ outputting the bias voltage $VB_5$ to a gate of the ninth NMOS transistor and a gate of the tenth NMOS transistor respectively.

3. The fully-differential two-stage operational amplifier circuit according to claim 2, wherein the second-stage amplifying circuit further comprises an eighth PMOS transistor, a ninth PMOS transistor, an eleventh NMOS transistor and a twelfth NMOS transistor, a source of the eighth PMOS transistor and a source of the ninth PMOS transistor being respectively connected with the external power supply VDD, a drain of the eighth PMOS transistor being connected with a drain of the eleventh NMOS transistor, and a drain of the ninth PMOS transistor being connected with a drain of the twelfth NMOS transistor, a source of the eleventh NMOS transistor and a source of the twelfth NMOS transistor being both grounded, the drain of the sixth PMOS transistor being connected with a gate of the eleventh NMOS transistor, and the drain of the seventh PMOS transistor being connected with a gate of the twelfth NMOS transistor; and the drain of the first PMOS transistor outputting the common-mode feedback signal $VB_2$ to a gate of the eighth PMOS transistor and a gate of the ninth PMOS transistor respectively.

4. The fully-differential two-stage operational amplifier circuit according to claim 3, further comprising a frequency compensation circuit, the frequency compensation circuit comprising a first resistor, a second resistor, a first capacitor and a second capacitor, the first resistor and the first capacitor being connected in series, a terminal of the first resistor being connected with the drain of the eleventh NMOS transistor and a terminal of the first capacitor being connected with the drain of the sixth PMOS transistor; and the second resistor and the second capacitor being connected in series, a terminal of the second resistor being connected with the drain of the twelfth NMOS transistor and a terminal of the second capacitor being connected with the drain of the seventh PMOS transistor.

5. The fully-differential two-stage operational amplifier circuit according to claim 4, wherein the common-mode signal acquisition circuit further comprises a third resistor, a fourth resistor, a third capacitor and a fourth capacitor, the third resistor and the fourth resistor being connected in series between the differential output signals $OUT_P$ and $OUT_N$; the third capacitor and the fourth capacitor being connected in series between the differential output signals $OUT_P$ and $OUT_N$; the third resistor and the third capacitor being connected in parallel, the fourth resistor and the fourth capacitor being connected in parallel; and the operational amplifier output common-mode signal $V_{CMO}$ being output at a common connecting point of the third resistor, the fourth resistor, the third capacitor and the fourth capacitor.

6. The fully-differential two-stage operational amplifier circuit according to claim 1, wherein the first PMOS transistor and the second PMOS transistor are PMOS transistors of a same type, and the first NMOS transistor and the second NMOS transistor are NMOS transistors of a same type.

7. The fully-differential two-stage operational amplifier circuit according to claim 4, wherein the first resistor and the second resistor are of a same type, and the first capacitor and the second capacitor are of a same type.

8. The fully-differential two-stage operational amplifier circuit according to claim 5, wherein the third resistor and the fourth resistor are of a same type, and the third capacitor and the fourth capacitor are of a same type.

9. The fully-differential two-stage operational amplifier circuit according to claim 2, wherein the first PMOS transistor and the second PMOS transistor are PMOS transistors of a same type, and the first NMOS transistor and the second NMOS transistor are NMOS transistors of a same type.

10. The fully-differential two-stage operational amplifier circuit according to claim 3, wherein the first PMOS transistor and the second PMOS transistor are PMOS transistors of a same type, and the first NMOS transistor and the second NMOS transistor are NMOS transistors of a same type.

11. The fully-differential two-stage operational amplifier circuit according to claim 4, wherein the first PMOS transistor and the second PMOS transistor are PMOS transistors of a same type, and the first NMOS transistor and the second NMOS transistor are NMOS transistors of a same type.

\* \* \* \* \*